United States Patent
Zhan

(10) Patent No.: US 7,655,487 B2
(45) Date of Patent: Feb. 2, 2010

(54) WHITE LIGHT EMITTING DIODE (WLED) AND PACKING METHOD THEREOF

(75) Inventor: Xian-wu Zhan, Yuyao (CN)

(73) Assignee: Ningbo Andy Optoelectronic Co., Ltd., Zhejiang (CN)

( * ) Notice: Subject to any disclaimer, the term of this patent is extended or adjusted under 35 U.S.C. 154(b) by 0 days.

(21) Appl. No.: 12/235,153

(22) Filed: Sep. 22, 2008

(65) Prior Publication Data

US 2009/0159914 A1 Jun. 25, 2009

(30) Foreign Application Priority Data

Dec. 20, 2007 (CN) .................. 2007 1 0172636

(51) Int. Cl.
*H01L 21/00* (2006.01)
*H01L 33/00* (2006.01)

(52) U.S. Cl. .................. 438/29; 257/98; 257/E21.001; 257/E33.001

(58) Field of Classification Search .................. 257/98, 257/E21.001, E33.001; 438/29
See application file for complete search history.

(56) References Cited

U.S. PATENT DOCUMENTS

| 6,982,045 B2 * | 1/2006 | Menkara et al. ....... 252/301.4 F |
| 7,479,662 B2 * | 1/2009 | Soules et al. .................. 257/98 |
| 2006/0102914 A1 * | 5/2006 | Smits et al. .................. 257/98 |

* cited by examiner

*Primary Examiner*—Evan Pert

(57) ABSTRACT

A white light emitting diode (LED) and the packing method thereof are described. The white LED includes a supporting frame, a LED chip, glue for mixing phosphor powder, and phosphor powder, wherein the glue for mixing phosphor powder comprises a first set of compositions and a second set of compositions, the first set of compositions comprises poly-dimethyl-siloxane, and the second set of compositions comprises the copolymer having dimethyl-siloxane, methyl hydrogen siloxane and vinyl-siloxane wherein the copolymer has a weight percentage from about 94% to 99%, the dimethyl-siloxane has a weight percentage from about 84% to 90%, the methyl hydrogen siloxane has a weight percentage from about 4% to 9%, and the vinyl-siloxane has a weight percentage from about 2% to 7%.

20 Claims, 5 Drawing Sheets

WHITE LIGHT EMITTING DIODE (WLED) AND PACKING METHOD THEREOF

FIELD OF THE INVENTION

The present invention relates to a light emitting diode (LED) and method thereof, and more particularly relates to a white light emitting diode (WLED) having lower luminance decay and packing method thereof.

BACKGROUND OF THE INVENTION

A light emitting (LED) is a semi-conductive lighting element widely which is used and serves as an indicator light and a display screen. People praise the white light emitting diode (WLED) as the fourth generation light source which substitutes for fluorescent lights and incandescent lights. Theoretically, although the life span of LEDs is 100,000 hours, however, the life span of a white light emitting diode (WLED) in the spot market is much less than the theoretical time of 100,000 hours.

FIG. 1 is a graph of a test profile of luminance decay for a conventional white light emitting diode (WLED) wherein the WLED is tested at a constant current 25 mA in the room temperature 25° C. during a continuous duration of 2520 hours. The horizontal axis represents time and the vertical axis represents the luminous flux maintenance percentage. According to the graph, the rate of luminance decay at $168^{th}$ hour is 13%, the rate of luminance decay at $336^{th}$ hour is 20%, the rate of luminance decay at $504^{th}$ hour is 25%, the rate of luminance decay at $648^{th}$ hour is 31%, the rate of luminance decay at $1128^{th}$ hour is 49%, and the rate of luminance decay at $2520^{th}$ hour is 80%. To further verify the rate of luminance decay, the WLED is tested at a constant current 40 mA in room temperature 25° C. during a continuous duration of 1032 hours, as shown in FIG. 2. The rates of luminance decay at $168^{th}$, $336^{th}$, $504^{th}$, and $1032^{th}$ hours are 34%, 45%, 68%, and 88%, respectively.

In view of luminance decay of WLED, many manufactures attempt to make efforts to reduce luminance decay. For example, as shown in FIG. 3, it is a graph of a test profile of luminance decay for a conventional WLED, mode number of "NSPW500CS", manufactured by "NICHIA" Corporation wherein the WLED is tested at a constant current 25 mA in room temperature 25° C. during a continuous duration of 2520 hours. According to the graph, the rate of luminance decay at $168^{th}$ hour is 3%, the rate of luminance decay at $336^{th}$ hour is 5%, the rate of luminance decay at $504^{th}$ hour is 8%, the rate of luminance decay at $648^{th}$ hour is 10%, the rate of luminance decay at $1128^{th}$ hour is 12%, and the rate of luminance decay at $2520^{th}$ hour is 24%. To further verify the rate of luminance decay, the WLED is tested at a constant current 40 mA in room temperature 25° C. during a continuous duration of 1032 hours, as shown in FIG. 4. The rates of luminance decay at $168^{th}$, $336^{th}$, $504^{th}$, and $1032^{th}$ hours are 10%, 13%, 14%, and 24%, respectively.

FIG. 5 is a graph of a test profile of luminance decay for a conventional WLED, mode number of "LC503TWN1-15Q-A1", manufactured by "COTCO" Corporation wherein the WLED is tested at a constant current 25 mA in room temperature 25° C. during a continuous duration of 2520 hours. According to the graph, the increment of luminous flux maintenance percentage at $168^{th}$ hour is 4%, the luminous flux maintenance percentage at $336^{th}$ hour is still 104%, the luminous flux maintenance percentage at $504^{th}$ hour is dropped as 103%, the luminous flux maintenance percentage at $648^{th}$ hour is continuously dropped as 101%, the rate of luminance decay at $1128^{th}$ hour is 3%, and the rate of luminance decay at $2520^{th}$ hour is up to 9%. To further verify the rate of luminance decay, the WLED is tested at a constant current 40 mA in room temperature 25° C. during a continuous duration of 1032 hours, as shown in FIG. 6. The increment of luminous flux maintenance percentage at $168^{th}$ hour is 4%, the rate of luminance decay at $336^{th}$ hour is 2%, the rate of luminance decay at $504^{th}$ hour is 7%, and the rate of luminance decay at $1032^{th}$ hour is up to 17%.

According to the above-mentioned descriptions, the luminance decay of the WLEDs manufactured by "NICHIA" and "COTCO" is reduced. However, the prices of WLEDs are much too high, thereby increasing the manufacturing cost of the WLEDs and restricting their application fields.

SUMMARY OF THE INVENTION

To solve the above-mentioned problems, the present invention is to provide a white light emitting diode (WLED) and the packing method thereof to improve the luminance decay and manufacturing cost, and increase the life span of the WLEDs.

The present invention sets forth a white light emitting diode (WLED) and the packing method thereof. The white light emitting diode (WLED) comprises a supporting frame, an LED chip, glue for mixing phosphor powder, and phosphor powder, wherein the glue for mixing phosphor powder comprises a first set of compositions and a second set of compositions. The first set of compositions comprises polydimethylsiloxane, and the second set of compositions comprises the copolymer having dimethyl siloxane, methyl hydrogen siloxane and vinyl-siloxane wherein the copolymer has a weight percentage from about 94% to 99%, the dimethyl-siloxane has a weight percentage from about 84% to 90%, the methyl-siloxane has a weight percentage from about 4% to 9%, and the vinyl-siloxane has a weight percentage from about 2% to 7%.

The copolymer has the weight percentage of 98%, the dimethyl-siloxane has the weight percentage of 87%, the methyl hydrogen siloxane has the weight percentage of 7%, and the vinyl-siloxane has the weight percentage of 4%.

The second set of compositions further comprises γ-(2,3-epoxypropoxy)-propyl-trimethoxysilane and glycidyl γ-(trimethoxysilyl)-propyl-ether, which has a weight percentage from about 0.5% to 3%.

The γ-(2,3-epoxypropoxy)-propyl-trimethoxysilane and glycidyl γ-(trimethoxysilyl)-propyl-ether has the weight percentage of 1%.

The second set of compositions further comprises triethoxymethyl-silane, which has the weight percentage from about 0.5% to 3%.

The triethoxymethyl-silane has the weight percentage of 1%.

The first set of compositions and the second set of compositions in the glue for mixing phosphor powder are blended based on a weight ratio of 1:1, respectively.

The phosphor powder, the first set of compositions and the second set of compositions in the glue for mixing phosphor powder are blended based on the weight ratio of 1:3:3, respectively.

In the present invention, a method of packing a WLED comprises the following steps of:

(1) injecting the insulating glue into a reflecting cup of a supporting frame for fixing a LED chip;

(2) mounting an LED chip on the reflecting cup of the supporting frame for fixing the LED chip;

(3) performing a curing process after the step of fixing the LED chip for attaching the LED chip to the supporting frame stably;

(4) bonding at least two lead conducting wires on a positive electrode and a negative electrode of the cured LED chip;

(5) blending the phosphor powder, wherein the first set of compositions, the second set of compositions, and the phosphor powder are prepared and stirred so that the combined materials are mixed uniformly, the first set of compositions comprises polydimethyl-siloxane (PDMS), and the second set of compositions comprises copolymer having dimethyl-siloxane, methyl hydrogen siloxane and vinyl-siloxane wherein the copolymer of the second set of compositions has a weight percentage from about 94% to 99%, the dimethyl-siloxane has a weight percentage from about 84% to 90%, the methyl hydrogen siloxane has a weight percentage from about 4% to 9%, and the vinyl-siloxane has a weight percentage from about 2% to 7%.

dispensing the phosphor powder, wherein the combined materials, comprising the first set of compositions, the second set of compositions, and the phosphor powder, is dispensed to the reflecting cup of the supporting frame having the at least two lead conducting wires;

performing a curing process after the step of dispensing the phosphor powder for solidifying the combined materials;

allocating epoxy glue for preparing encapsulant;

molding by filling the epoxy glue; and performing a curing process after the step of molding by filling the epoxy glue.

During the step of dispensing the phosphor powder, the phosphor powder, the first set of compositions and the second set of compositions are blended based on the weight ratio of 1:3:3, respectively.

The copolymer has the weight percentage of 98%, the dimethyl-siloxane has the weight percentage of 87%, the methyl hydrogen siloxane has the weight percentage of 7%, and the vinyl-siloxane has the weight percentage of 4%.

The second set of compositions further comprises γ-(2,3-epoxypropoxy)-propyl-trimethoxysilane and glycidyl γ-(trimethoxysilyl)-propyl-ether, which has a weight percentage from about 0.5% to 3%.

The γ-(2,3-epoxypropoxy)-propyl-trimethoxysilane and glycidyl γ-(trimethoxysilyl)-propyl-ether has the weight percentage of 1%.

The second set of compositions further comprises triethoxymethyl-silane, which has a weight percentage from about 0.5% to 3%.

The triethoxymethyl-silane has the weight percentage of 1%.

During the step of performing a curing process after the step of dispensing the phosphor powder, the curing temperature is from about 130° C. to 150° C. and the curing time is from about one hour to two hours.

In comparison with the conventional WLED, the present invention adopts that the first set of compositions and the second set of compositions are mixed and combined for packaging and controlling the curing temperature and backing time. Thus, the luminance decay of the WLEDs is effectively reduced and the life span of the WLEDs is increased. Consequently, the WLED and packing method thereof in the present invention has much lower luminance decay and lower manufacturing cost for broadening the application fields of WLEDs.

BRIEF DESCRIPTION OF THE DRAWINGS

The foregoing aspects and many of the attendant advantages of this invention will become more readily appreciated as the same becomes better understood by a reference to the following detailed description, when taken in conjunction with the accompanying drawings, wherein.

DETAILED DESCRIPTION OF THE INVENTION

The white light emitting diode (WLED) includes a supporting frame, a light emitting diode (LED) chip, the glue for mixing phosphor powder, and the phosphor powder. The LED chip is attached to the supporting frame. The phosphor powder and the glue for mixing phosphor powder are blended therewith based on a prescription ratio. The glue for mixing phosphor powder includes a first set of compositions and a second set of compositions, which are liquid and dense statuses. The first set of compositions contains polydimethyl-siloxane (PDMS). The second set of compositions contains copolymer having dimethyl-siloxane, methyl hydrogen siloxane and vinyl-siloxane. The molecular structure is described below:

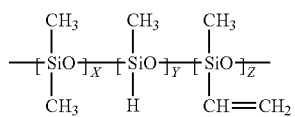

The second set of compositions further contains γ-(2,3-epoxypropoxy)-propyl-trimethoxysilane and glycidyl γ-(trimethoxysilyl)-propyl-ether, and triethoxymethyl-silane, which are described by the following molecular structure, respectively:

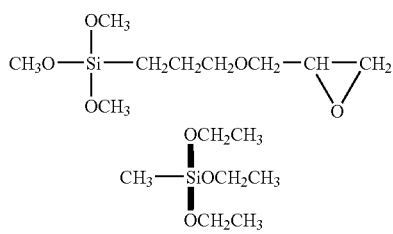

In one embodiment, the copolymer of the second set of compositions has a weight percentage from about 94% to 99%, wherein the copolymer preferably has a weight percentage of 98%. The dimethyl-siloxane has a weight percentage from about 84% to 90%, wherein the dimethyl-siloxane preferably has a weight percentage of 87%. The methyl hydrogen siloxane has a weight percentage from about 4% to 9%, wherein the methyl hydrogen siloxane preferably has a weight percentage of 7%. The vinyl-siloxane has a weight percentage from about 2% to 7%, wherein the vinyl-siloxane preferably has a weight percentage of 4%. In the second set of compositions, γ-(2,3-epoxypropoxy)-propyl-trimethoxysilane and glycidyl γ-(trimethoxysilyl)-propyl-ether has a weight percentage from about 0.5% to 3%, wherein the γ-(2,3-epoxypropoxy)-propyl-trimethoxysilane and glycidyl γ-(trimethoxysilyl)-propyl-ether preferably has a weight percentage of 1%. The triethoxymethyl-silane has a weight percentage from about 0.5% to 3%, wherein the triethoxymethyl-silane preferably has a weight percentage of 1%.

In one preferred embodiment of the present invention, the blue ray of the WLED chip has a peak emission wavelength from about 455 to 465 nano-meters (nm). For example, the glue for fixing the chip is an insulating glue and the phosphor powder is a silicate fluorescent powder. The supporting frame is a metal structure, such as an iron frame. The first set of compositions and the second set of compositions in the glue for mixing phosphor powder are blended based on the weight ratio of 1:1, respectively. The phosphor powder, the first set of compositions and the second set of compositions in the glue for mixing phosphor powder are blended based on the weight ratio of 1:3:3, respectively. Person skilled in the art should be noted that the phosphor powder is selected from a group consisting of yttrium-aluminum-garnet (YAG) powder, terbium-aluminum-garnet (TAG) powder, sulfide powder, and combinations.

Figure 1:
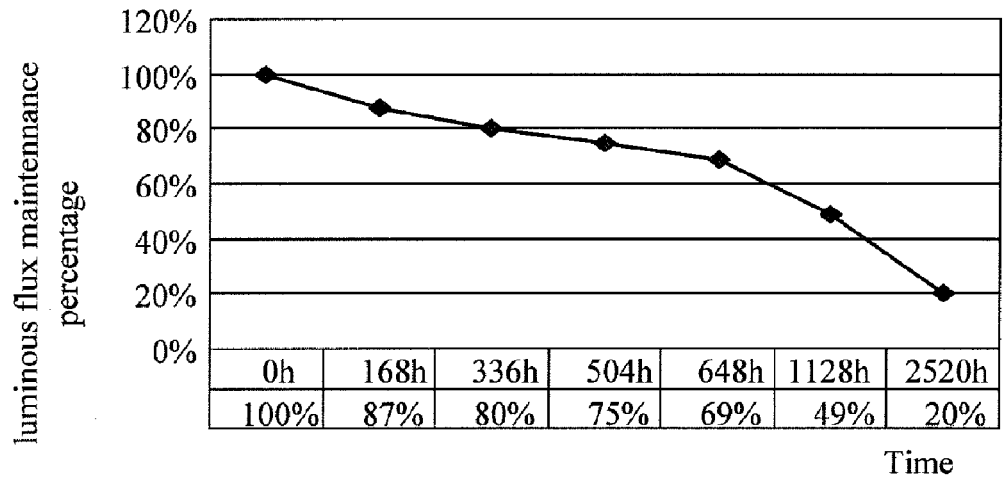
FIG. 1 is a graph of a test profile of luminance decay for a conventional white light emitting diode (WLED) wherein the WLED is tested at a constant current 25 mA in room temperature 25° C. during a continuous duration of 2520 hours.
Figure 2:
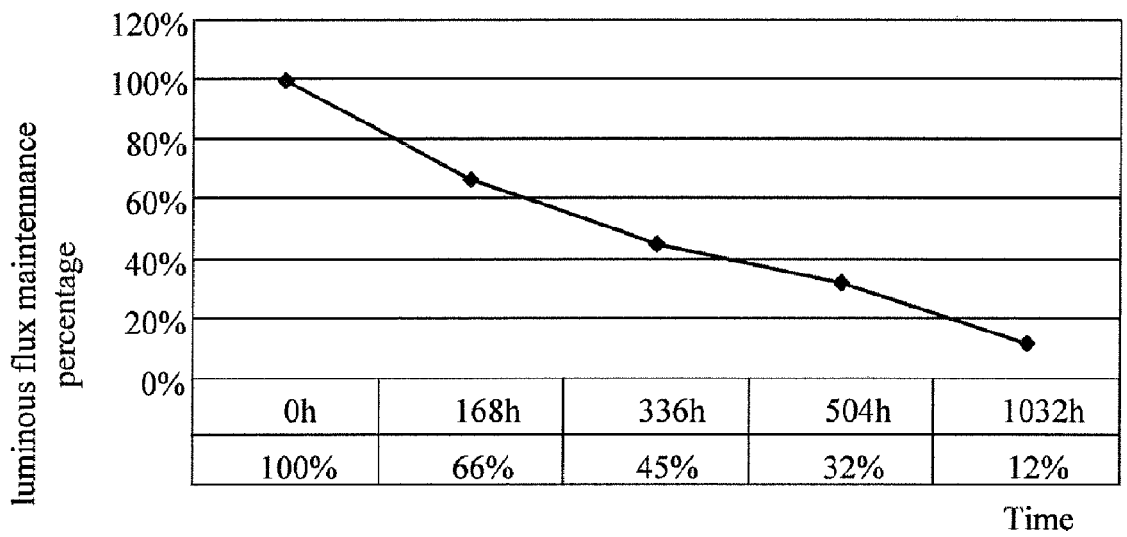
FIG. 2 is a graph of a test profile of luminance decay for the conventional WLED wherein the WLED is tested at constant current 40 mA in room temperature 25° C. during a continuous duration of 1032 hours.
Figure 3:
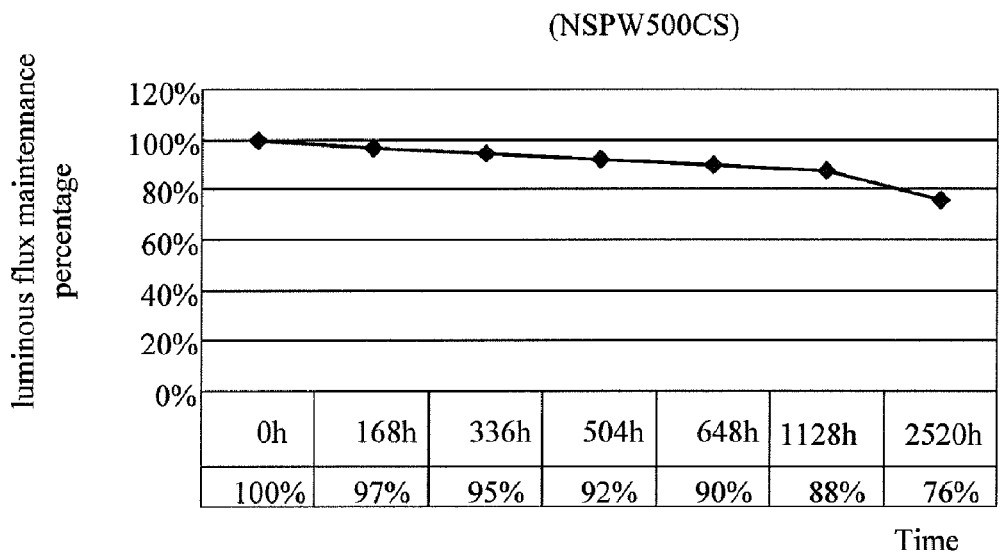
FIG. 3 is a graph of a test profile of luminance decay for a conventional WLED, mode number of "NSPW500CS", manufactured by "NICHIA" Corporation wherein the WLED is tested at constant current 25 mA in room temperature 25° C. during a continuous duration of 2520 hours.
Figure 4:
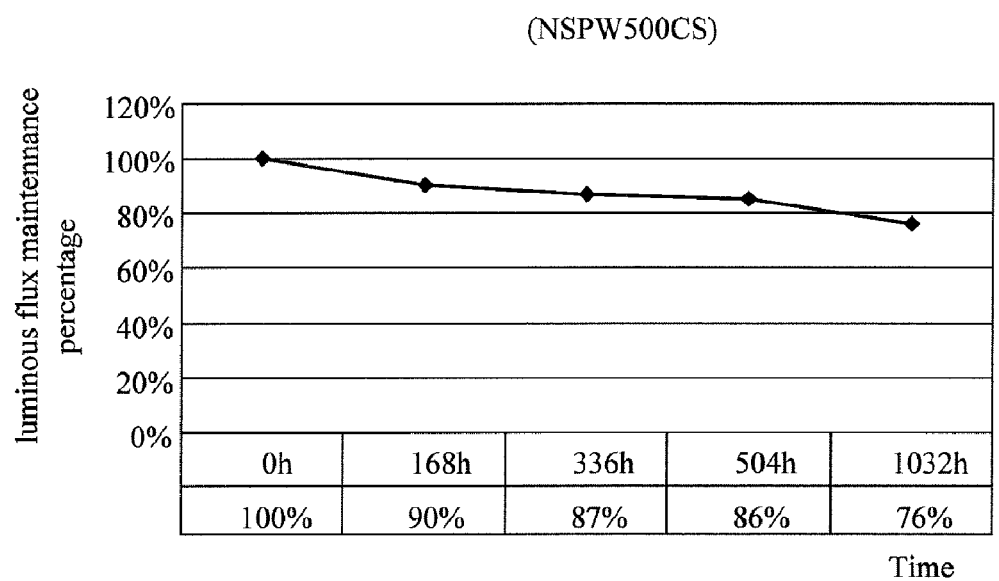
FIG. 4 is a graph of a test profile of luminance decay for a conventional white LED, mode number of "NSPW500CS", manufactured by "NICHIA" Corporation wherein the WLED is tested at constant current 40 mA in room temperature 25° C. during a continuous duration of 1032 hours.
Figure 5:
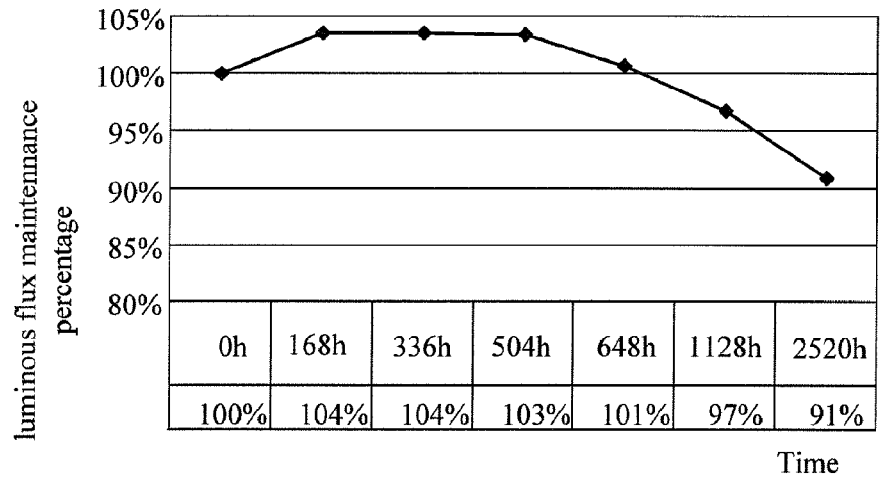
FIG. 5 is a graph of a test profile of luminance decay for a conventional white LED, mode number of "LC503TWN1-15Q-A1", manufactured by "COTCO" Corporation wherein the WLED is tested at constant current 25 mA in room temperature 25° C. during a continuous duration of 2520 hours.
Figure 6:
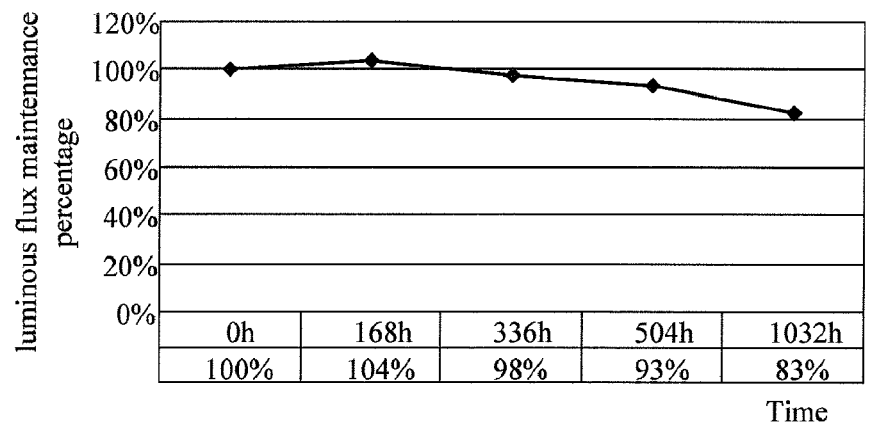
FIG. 6 is a graph of a test profile of luminance decay for a conventional white LED, mode number of "LC503TWN1-15Q-A1", manufactured by "COTCO" Corporation wherein the WLED is tested at constant current 40 mA in room temperature 25° C. during a continuous duration of 1032 hours.
Figure 7:
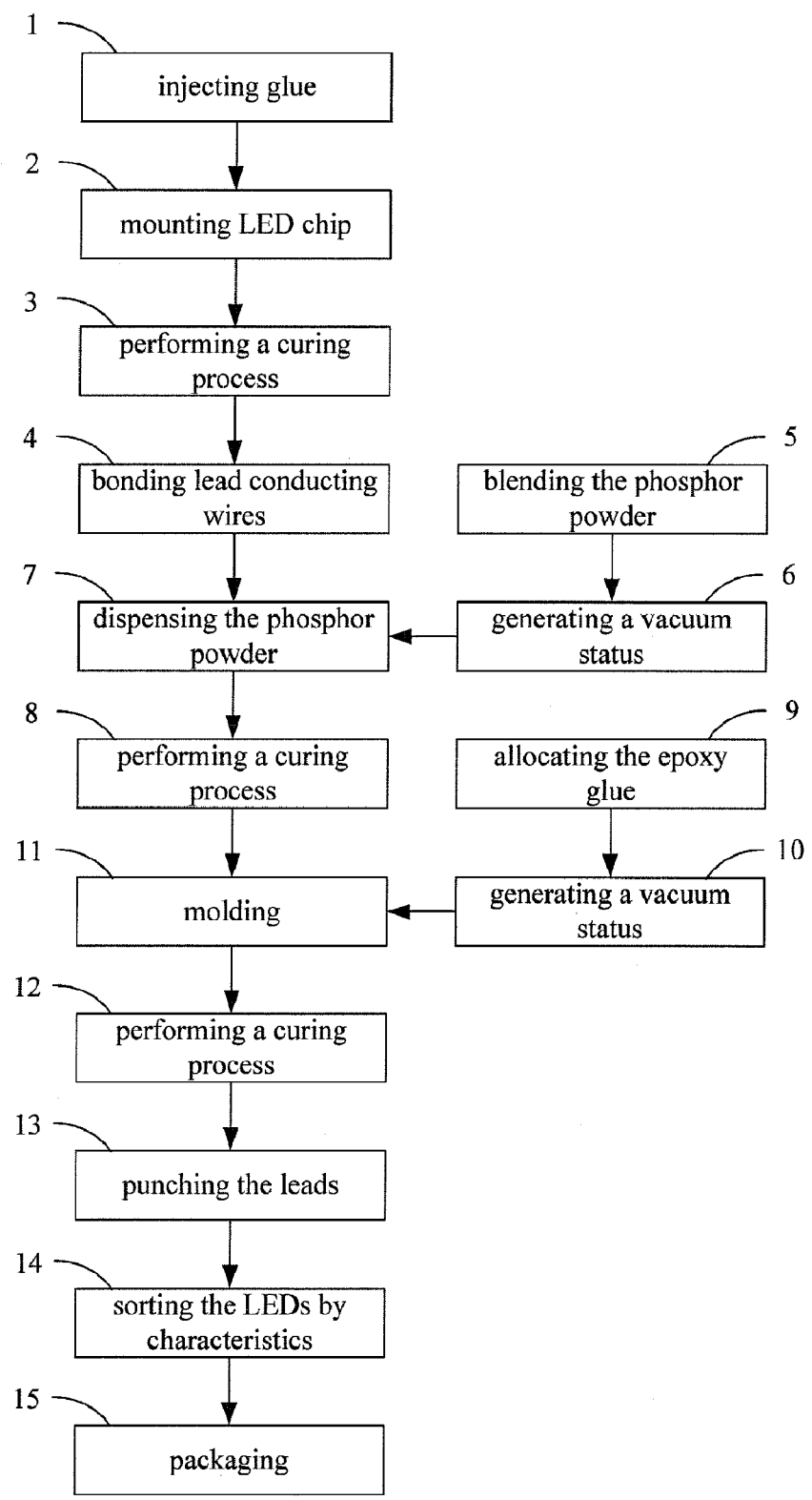
FIG. 7 is a flow chart of packing a WLED according to one embodiment of the present invention.

FIG. 7 is a flow chart of the method for packing a WLED according to one embodiment of the present invention. The method includes the following steps:

Step 1: injecting glue. The insulating glue for fixing the LED chip is injected into the reflecting cup of the supporting frame therein for dispensing the glue.

Step 2: mounting the LED chip. The LED chip is placed on the reflecting cup of the supporting frame to be fixed by the insulating glue.

Step 3: performing a curing process after the step of fixing the LED chip. The semi-finished material having the fixed chip is put into the bake oven to be cured so that the LED chip is attached to the supporting frame stably.

Step 4: bonding lead conducting wires, such as aurum (Au) wires. For example, two lead conducting wires are soldered on the positive electrode and the negative electrode of the cured LED chip therefrom.

Step 5: blending the phosphor powder. The first set of compositions, the second set of compositions, and the phosphor powder are prepared and stirred so that the combined materials are mixed uniformly, wherein the time of stirring the combined materials may be for a specific time span, such as five minutes, to be mixed adequately. In one embodiment, the first set of compositions contains polydimethyl-siloxane (PDMS). The second set of compositions contains copolymer having dimethyl-siloxane, methyl hydrogen siloxane and vinyl-siloxane. The copolymer of the second set of compositions has a weight percentage from about 94% to 99%, wherein the copolymer preferably has a weight percentage of 98%. The dimethyl-siloxane has a weight percentage from about 84% to 90%, wherein the dimethyl-siloxane preferably has a weight percentage of 87%. The methyl hydrogen siloxane has a weight percentage from about 4% to 9%, wherein the methyl hydrogen siloxane preferably has a weight percentage of 7%. The vinyl-siloxane has a weight percentage from about 2% to 7%, wherein the vinyl-siloxane preferably has a weight percentage of 4%.

Step 6: generating a vacuum status. A vacuum deaerating process is performed on the combined materials including the first set of compositions, the second set of compositions, and the phosphor powder in the step 6. The time span of generating a vacuum status on the combined materials may be specific time duration, such as from five minutes to ten minutes.

Step 7: dispensing the phosphor powder. The combined materials, including the first set of compositions, the second set of compositions, and the phosphor powder, in the vacuum status is poured into the syringe of a dispensing device and blended with glue. The combined materials blended with the glue is dispensed to the reflecting cup of the supporting frame having lead conducting wires.

Step 8: performing a curing process after the step of dispensing the phosphor powder. The supporting frame having the blended glue is put into the bake oven to be cured for solidifying the blended glue on the supporting frame. The curing temperature of the bake oven is from about 130° C. to 150° C. and the curing time is from about one hour to two hours.

Step 9: allocating the epoxy glue for preparing encapsulant. The "A" and "B" types of epoxy glue are pre-heated and mixed on the basis of weight ratio of 1:1. The mixed epoxy glue are then stirred and blended uniformly.

Step 10: generating a vacuum status. A vacuum deaerating process is performed on the mixed material including the "A" and "B" types of epoxy glue in the step 9. The time span of generating a vacuum status on the combined materials may be specific time duration, such as from five minutes to ten minutes.

Step 11: molding by filling the epoxy glue. The epoxy glue is injected into the cavity and/or the supporting frame by using a molding device.

Step 12: performing a curing process after the step of molding by filling the epoxy glue. The cavity and the supporting frame with the epoxy glue are put into the bake oven to be cured for solidifying the epoxy glue on the supporting frame. For example, the curing temperature of the bake oven is about 125° C. and the curing time is from about eight to ten hours.

Step 13: punching the leads. The leads are punched by a stamping for separating the positive electrode from the negative electrode.

Step 14: sorting the LEDs. A sorting machine sorts the LEDs based on the electrical characteristic parameters including voltage, brightness, and colors of the LEDs.

Step 15: performing a packing step for the sorted LED products.

The present invention makes a lot of tests on the white LEDs produced by above-mentioned packing method for verifying the luminance decay.

Figure 8:
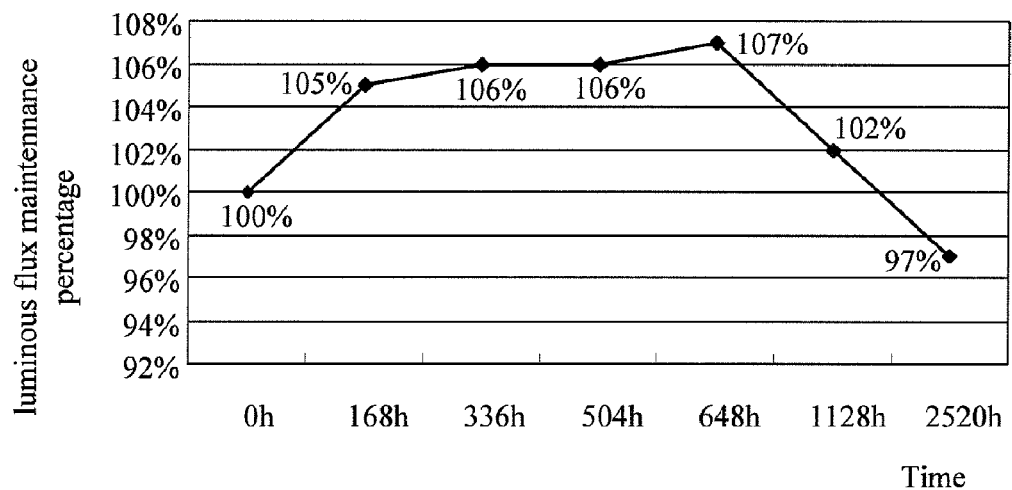
FIG. 8 is a graph of a test profile of luminance decay for a WLED wherein the WLED is tested at a constant current 25 mA in room temperature 25° C. during a continuous duration of 2520 hours according to one embodiment of the present invention.

FIG. 8 is a graph of a test profile of luminance decay for a WLED wherein the WLED is tested at a constant current 25 mA in room temperature 25° C. during a continuous duration of 2520 hours, according to one embodiment of the present invention. The horizontal axis represents time and the vertical axis represents the luminous flux maintenance percentage. According to the graph, the luminous flux maintenance percentage at $168^{th}$ hour is 105%, the luminous flux maintenance percentage at $336^{th}$ hour is 106%, the luminous flux maintenance percentage at $504^{th}$ hour is still 106%, the luminous flux maintenance percentage at $648^{th}$ hour is 107%, the luminous flux maintenance percentage at $1128^{th}$ hour is 102%, and the rate of luminance decay at $2520^{th}$ hour is 3%.

Figure 9:
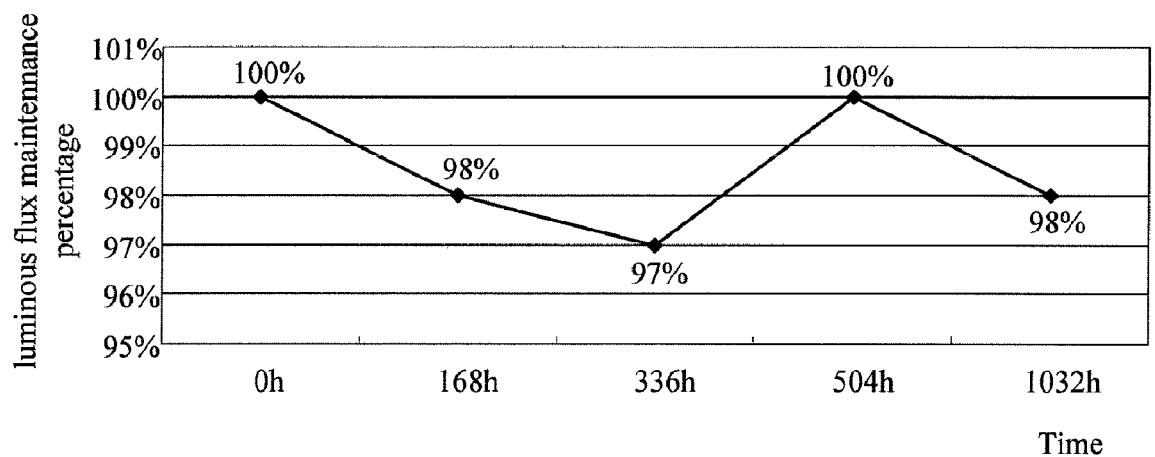
FIG. 9 is a graph of a test profile of luminance decay for the conventional WLED wherein the WLED is tested at a constant current 40 mA in room temperature 25° C. during a continuous duration of 1032 hours according to one embodiment of the present invention.

To further verify the rate of luminance decay, the WLED is tested at a constant current 40 mA in room temperature 25° C. during a continuous duration of 1032 hours, as shown in FIG. 9. The rate of luminance decay at $168^{th}$ hour is 2%, the rate of luminance decay at $336^{th}$ hour is 3%, the rate of luminance decay at $504^{th}$ hour is zero and the rate of luminance decay at $1032^{th}$ hour is only 2% advantageously.

Regarding the same test condition, it means: (1) the test is performed in the same laboratory with identical environmental conditions during the same time span; and (2) a plurality of the WLEDs, such as the amount of twenty WLEDs, are sampled randomly for each test.

The present invention makes a lot of tests to generate reliable experimental results. During the tests, a plurality of packing material and LED chips are tested and the inventor adopts that the first set of compositions and the second set of compositions are mixed and combined. It is found that the luminance decay of the WLEDs is effectively reduced and the life span of the WLEDs is increased. Consequently, the WLED and packing method thereof in the present invention has much lower luminance decay and manufacturing cost for broadening the application fields of WLEDs.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A white light emitting diode (WLED), comprising a supporting frame, a light emitting diode (LED) chip, glue for mixing phosphor powder, and a phosphor powder, wherein the glue for mixing phosphor powder comprises a first set of compositions and a second set of compositions, the first set of compositions comprises polydimethyl-siloxane, and the second set of compositions comprises the copolymer having dimethyl-siloxane, methyl hydrogen siloxane and vinyl-siloxane wherein the copolymer has a weight percentage from about 94% to 99%, the dimethyl-siloxane has a weight percentage from about 84% to 90%, the methyl hydrogen siloxane has a weight percentage from about 4% to 9%, and the vinyl-siloxane has a weight percentage from about 2% to 7%.

2. The WLED of claim 1, wherein the copolymer has the weight percentage of 98%, the dimethyl-siloxane has the weight percentage of 87%, the methyl hydrogen siloxane has the weight percentage of 7%, and the vinyl-siloxane has the weight percentage of 4%.

3. The WLED of claim 2, wherein the second set of compositions further comprises γ-(2,3-epoxypropoxy)-propyl-trimethoxysilane and glycidyl γ-(trimethoxysilyl)-propyl-ether, which has a weight percentage from about 0.5% to 3%.

4. The WLED of claim 2, wherein the second set of compositions further comprises triethoxymethyl-silane, which has the weight percentage from about 0.5% to 3%.

5. The WLED of claim 2, wherein the first set of compositions and the second set of compositions in the glue for mixing phosphor powder are blended based on a weight ratio of 1:1, respectively.

6. The WLED of claim 1, wherein the second set of compositions further comprises γ-(2,3-epoxypropoxy)-propyl-trimethoxysilane and glycidyl γ-(trimethoxysilyl)-propyl-ether, which has a weight percentage from about 0.5% to 3%.

7. The WLED of claim 6, wherein the γ-(2,3-epoxypropoxy)-propyl-trimethoxysilane and glycidyl γ-(trimethoxysilyl)-propyl-ether has the weight percentage of 1%.

8. The WLED of claim 1, wherein the second set of compositions further comprises triethoxymethyl-silane, which has the weight percentage from about 0.5% to 3%.

9. The WLED of claim 8, wherein the triethoxymethyl-silane has the weight percentage of 1%.

10. The WLED of claim 1, wherein the first set of compositions and the second set of compositions in the glue for mixing phosphor powder are blended based on a weight ratio of 1:1, respectively.

11. The WLED of claim 10, wherein the phosphor powder, the first set of compositions and the second set of compositions in the glue for mixing phosphor powder are blended based on the weight ratio of 1:3:3, respectively.

12. A method of packing a WLED, comprising the steps of:
   injecting the insulating glue into a reflecting cup of a supporting frame;
   mounting an LED chip on the reflecting cup of the supporting frame for fixing the LED chip;
   performing a curing process after fixing the LED chip for attaching the LED chip to the supporting frame stably;
   bonding at least two lead conducting wires on a positive electrode and a negative electrode of the cured LED chip;
   blending the phosphor powder, wherein the first set of compositions, the second set of compositions, and the phosphor powder are prepared and stirred so that the combined materials are mixed uniformly, the first set of compositions comprises polydimethyl-siloxane (PDMS), and the second set of compositions comprises copolymer having dimethyl-siloxane, methyl hydrogen siloxane and vinyl-siloxane wherein the copolymer of the second set of compositions has a weight percentage from about 94% to 99%, the dimethyl-siloxane has a weight percentage from about 84% to 90%, the methyl hydrogen siloxane has a weight percentage from about 4% to 9%, and the vinyl-siloxane has a weight percentage from about 2% to 7%;
   dispensing the phosphor powder, wherein the combined materials, comprising the first set of compositions, the second set of compositions and the phosphor powder, are dispensed to the reflecting cup of the supporting frame having the at least two lead conducting wires;

performing a curing process after dispensing the phosphor powder for solidifying the combined materials;

allocating epoxy glue;

molding by filling the epoxy glue; and performing a curing process after filling the epoxy glue.

13. The method of claim 12, wherein during the step of dispensing the phosphor powder, the phosphor powder, the first set of compositions and the second set of compositions are blended based on the weight ratio of 1:3:3, respectively.

14. The method of claim 13, wherein the copolymer has the weight percentage of 98%, the dimethyl-siloxane has the weight percentage of 87%, the methyl hydrogen siloxane has the weight percentage of 7%, and the vinyl-siloxane has the weight percentage of 4%.

15. The method of claim 12, wherein the copolymer has the weight percentage of 98%, the dimethyl-siloxane has the weight percentage of 87%, the methyl hydrogen siloxane has the weight percentage of 7%, and the vinyl-siloxane has the weight percentage of 4%.

16. The method of claim 15, wherein the second set of compositions further comprises γ-(2,3-epoxypropoxy)-propyl-trimethoxysilane and glycidyl γ-(trimethoxysilyl)-propyl-ether, which has a weight percentage from about 0.5% to 3%.

17. The method of claim 16, wherein the γ-(2,3-epoxypropoxy)-propyl-trimethoxysilane and glycidyl γ-(trimethoxysilyl)-propyl-ether has the weight percentage of 1%.

18. The method of claim 15, wherein the second set of compositions further comprises triethoxymethyl-silane, which has a weight percentage from about 0.5% to 3%.

19. The method of claim 18, wherein the triethoxymethyl-silane has the weight percentage of 1%.

20. The method of claim 12, wherein during the step of performing a curing process after the step of dispensing the phosphor powder, the curing temperature is from about 130° C. to 150° C. and the curing time is from about one hour to two hours.

* * * * *